(12) United States Patent
Shibata et al.

(10) Patent No.: US 6,864,502 B2
(45) Date of Patent: Mar. 8, 2005

(54) III GROUP NITRIDE SYSTEM COMPOUND SEMICONDUCTOR LIGHT EMITTING ELEMENT

(75) Inventors: Naoki Shibata, Aichi-ken (JP); Takahiro Kozawa, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/664,056

(22) Filed: Sep. 17, 2003

(65) Prior Publication Data

US 2004/0169186 A1 Sep. 2, 2004

(30) Foreign Application Priority Data

Sep. 18, 2002 (JP) ........................................ 2002-271630

(51) Int. Cl.[7] .......................... H01L 29/06; H01L 31/72; H01L 31/109; H01L 31/328; H01L 31/336; H01L 33/00
(52) U.S. Cl. .............................. 257/14; 257/88; 257/90
(58) Field of Search .......................... 257/12–14, 88–98

(56) References Cited

U.S. PATENT DOCUMENTS 6,541,797 B1 * 4/2003 Udagawa ...................... 257/94
6,727,518 B2 * 4/2004 Uemura et al. ................ 257/98
6,791,120 B2 * 9/2004 Toda et al. .................. 257/103

FOREIGN PATENT DOCUMENTS

JP         2000-294884         10/2000

OTHER PUBLICATIONS

Hideki Hirayama, et al., "300 nm band high intensity ultraviolet LED using four element mixed crystal InAl-GaN", Monthly Display Aug. 2001 Separate Volume, , Aug. 2001.

* cited by examiner

Primary Examiner—Cuong Nguyen
(74) Attorney, Agent, or Firm—McGinn & Gibb, PLLC

(57) ABSTRACT

A III group nitride system compound semiconductor light emitting element has a quantum well structure that includes a well layer of $Al_{X1}Ga_{Y1}In_{1-X1-Y1}N$, where $0<X1$, $0 \leq Y1$ and $X1+Y1<1$ and a barrier layer of $Al_{X2}Ga_{Y2}In_{1-X2-Y2}N$, where $0<X2$, $0 \leq Y2$ and $X2+Y2<1$. The Al composition (X2) of barrier layer is equal to or smaller than that (X1) of well layer.

8 Claims, 4 Drawing Sheets

III GROUP NITRIDE SYSTEM COMPOUND SEMICONDUCTOR LIGHT EMITTING ELEMENT

The present application is based on Japanese patent application No.2002-271630, the entire contents of which are incorporated herein by reference.

BACKGROUND OF THE INVENTION

1. Field of the Invention

This invention relates to a III group nitride system compound semiconductor light emitting element and, particularly, to a III group nitride system compound semiconductor light emitting element that includes a quantum well structure and emits light in the range of ultraviolet.

2. Description of the Related Art

Japanese patent application laid-open No.2000-294884 (prior art 1) discloses a light emitting element that has a well layer including Al with a large bandgap energy to offer a short-wavelength emission. In the light emitting element, both of well layer and barrier layer include Al and the Al composition of barrier layer is greater than that of well layer. Thereby, the difference in lattice constant between well layer and barrier layer is reduced to suppress piezo-electric field to achieve a high emission efficiency. Well layer in embodiment of prior art 1 is of three element mixed crystal, AlGaN.

On the other hand, "300 nm band high intensity ultraviolet LED using four element mixed crystal InAlGaN", Monthly Display 2001 August Separate Volume, August, 2001 (prior art 2) discloses a high-output short-wavelength light emitting element that uses four element mixed crystal, AlGaInN as III group nitride system compound semiconductor. Prior art 2, FIG. 8, shows a light emitting element that active layer of AlGaInN is sandwiched by AlGaN layers and the Al composition of the former layer is greater than that of the latter layers. However, the light emitting element in FIG. 8 includes no quantum well structure.

In the light emitting element of prior art 1, the difference in lattice constant between well layer and barrier layer is, as described above, reduced by introducing Al to both of well layer and barrier layer. However, the light emitting element of prior art 1 has the following problem.

In prior art 1, the Al composition of well layer is smaller than that of barrier layer. According as the Al composition I of well layer is increased to give a shorter wavelength emission, the Al composition of barrier layer has to be increased to exceed that of well layer. In this case, the barrier layer must be subject to an increase in crystalline defect and an increase in resistivity. As a result, the emission output thereof will be reduced.

SUMMARY OF THE INVENTION

It is an object of the invention to provide a light emitting element that can keep a high emission output even when its well layer includes Al to give a short-wavelength emission.

According to one aspect of the invention, a III group nitride system compound semiconductor light emitting element, comprises:

a quantum well structure that includes a well layer of $Al_{X1}Ga_{Y1}In_{1-X1-Y1}N$, where $0<X1$, $0 \leq Y1$ and $X1+Y1<1$ and a barrier layer of $Al_{X2}Ga_{Y2}In_{1-X2-Y2}N$, where $0<X2$, $0 \leq Y2$ and $X2+Y2<1$, wherein the Al composition (X2) of the barrier layer is equal to or smaller than that (X1) of the well layer.

According to another aspect of the invention, a III group nitride system compound semiconductor light emitting element, comprises:

a quantum well structure that includes a well layer of $Al_{X1}Ga_{Y1}In_{1-X1-Y1}N$, where $0<X1$, $0 \leq Y1$ and $X1+Y1<1$ and a barrier layer of $Al_{X2}Ga_{Y2}In_{1-X2-Y2}N$, where $0<X2$, $0 \leq Y2$ and $X2+Y2<1$, wherein the Al composition (X2) of the barrier layer is equal to or smaller than that (X1) of the well layer, and the In composition of the well layer is greater than that of the barrier layer.

In this invention, well layer is of three element mixed crystal, AlInN or four element mixed crystal, AlGaInN. Thereby, short-wavelength light can be emitted with a higher emission output. Also, the Al composition of barrier layer is set to be equal to or smaller than that of well layer. Thereby, even when the Al composition of well layer increases, the Al composition of barrier layer is not increased exceeding that of well layer. Thus, the barrier layer can be prevented from being subject to an increase in crystalline defect and an increase in resistivity. As a result, a high emission output can be kept even when its well layer includes Al to give a short-wavelength emission.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
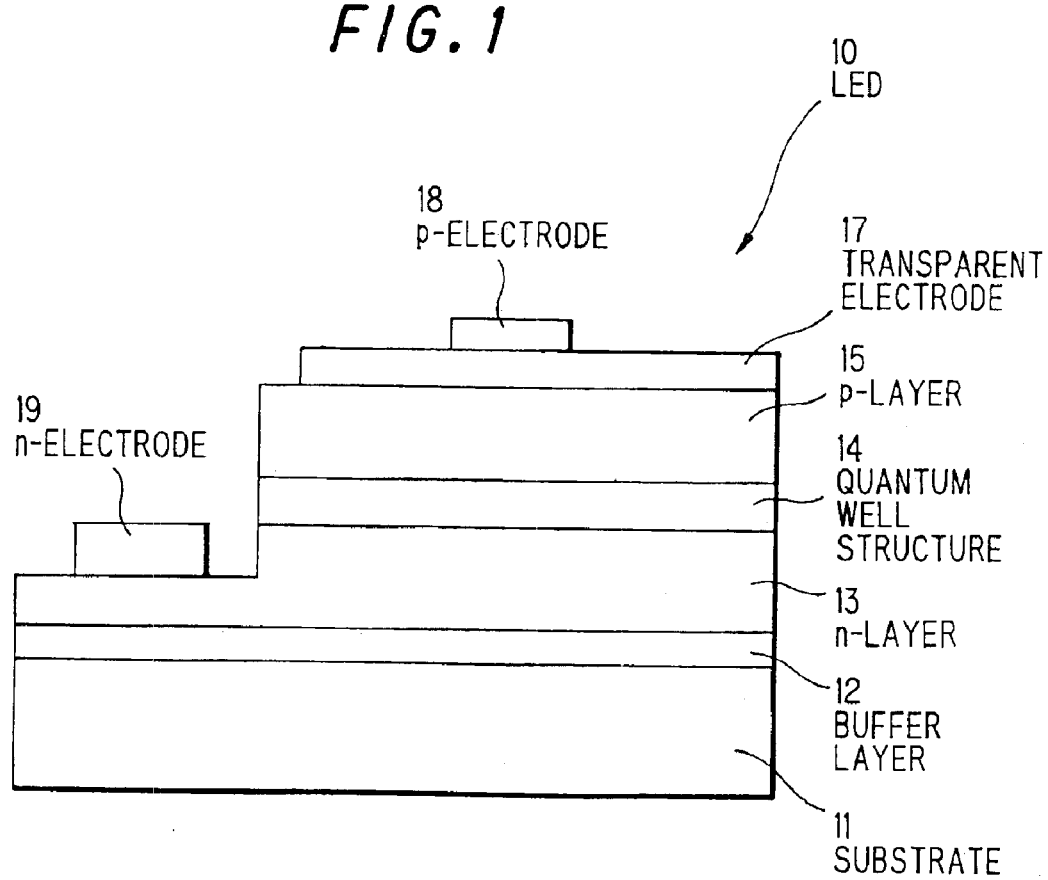
FIG. 1 is a schematic cross sectional view showing a light emitting element (LED) 10 in a preferred embodiment (Example 1) according to the invention.

III group nitride system compound semiconductor used in a light emitting element according to the invention will be explained below.

The III group nitride system compound semiconductor is represented by a general formula, $Al_XGa_YIn_{1-X-Y}N$, where $0 \leq X \leq 1$, $0 \leq Y \leq 1$ and $0 \leq X+Y \leq 1$. For example, it includes two-element group compound such as AlN, GaN and InN and three-element group compound such as $Al_XGa_{1-X}N$, $Al_XIn_{1-X}N$ and $Ga_XIn_{1-X}N$, where $0<X<1$. Part of III group element may be replaced by boron (B), thallium (Tl) etc. Also, part of nitrogen (N) may be replaced by phosphorus (P), arsenic (As), antimony (Sb), bismuth (Bi) etc.

The III group nitride system compound semiconductor may include an arbitrary dopant (impurity). For example, an n-type impurity available is silicon (Si), germanium (Ge), selenium (Se), tellurium (Te), carbon (C) etc. A p-type impurity available is magnesium (Mg), zinc (Zn), beryllium (Be), calcium (Ca), strontium (Sr), barium (Ba) etc. After doping p-type impurity, the III group nitride system compound semiconductor may be subject to electron beam radiation, plasma radiation or annealing, which is, however, not needed necessarily.

The III group nitride system compound semiconductor can be fabricated using metalorganic chemical vapor deposition (MOCVD), molecular beam epitaxy (MBE), halide vapor phase epitaxy (HVPE), sputtering, ion plating etc.

Substrate for growing III group nitride system compound semiconductor layer is of, for example, sapphire, gallium nitride, spinel, silicon, silicon carbide, zinc oxide, gallium phosphide, gallium arsenide, magnesium oxide, manganese oxide, or III group nitride system compound semiconductor single crystal. Especially, sapphire substrate is preferable and a-face or c-face of sapphire substrate is further preferable to use.

The light emitting element of the invention is structured such that III group nitride system compound semiconductor layers as described above are grown on the substrate.

The light emitting element of the invention includes an active layer (light-emitting layer) that has a quantum well structure, which includes multiquantum well and single quantum well structures, of III group nitride system compound semiconductor.

The active layer includes a well layer of AlGaN where Al and In are essential elements. Thus, the well layer is of four element mixed crystal, $Al_{X1}Ga_{Y1}In_{1-X1-Y1}N$ (0<X1, 0≦Y1, X1+Y1<1) or three element mixed crystal, AlInN. X1 and Y1 can be properly chosen based on a lattice constant of sub-layer and a wavelength required for the light emitting element. When the sub-layer is GaN, it is preferable that X1 is about 2.5 times Y1.

The thickness of well layer is preferably 10 nm or less to form the quantum well structure. It is further preferably 1 to 8 nm, and still further preferably 2 to 4 nm.

The active layer also includes a barrier layer of AlGaInN where Al is essential element. Thus, the barrier layer is of four element mixed crystal, $Al_{X2}Ga_{Y2}In_{1-X2-Y2}N$ (0<X2, 0≦Y2, X2+Y2<1) or three element mixed crystal, AlInN.

Al composition X2 of the barrier layer is equal to or less than Al composition X1 of the well layer. In detail, it is preferable that relationship of X2≦X1≦1.5×X2 is satisfied.

The thickness of barrier layer is preferably 100 nm or less. It is further preferably 3 to 30 nm and still further preferably 5 to 20 nm.

As described above, the well layer includes In and the barrier layer also includes In when necessary. In has a smaller bandgap energy. Therefore, by controlling the composition of In and the composition of Al, which is essential element for the active layer of the invention, the bandgap energy of well layer and barrier layer can be adjusted suitably.

Examples of the light emitting element according to the invention will be described below.

EXAMPLE 1

FIG. 1 is a schematic cross sectional view showing a light emitting element (LED) 10 in Example 1. The details of layers composing the light emitting element 10 are as follows.

| Layers: | Composition |
|---|---|
| p-type layer 15: | p-GaN:Mg |
| quantum well structure 14: (two pairs) | $Al_{0.15}Ga_{0.79}In_{0.06}N$ (well layer) $Al_{0.15}Ga_{0.85}N$ (barrier layer) |
| n-type layer 13: | n-GaN:Si |
| buffer layer 12: | AlN |
| substrate 11: | sapphire | n-type layer 13 of GaN with n-type impurity Si doped is grown through buffer layer 12 on the substrate 11. Although the substrate 11 is of sapphire in this example, it may be of gallium nitride, spinel, silicon, silicon carbide, zinc oxide, gallium phosphide, gallium arsenide, magnesium oxide, manganese oxide, zirconium boride or III group nitride system compound semiconductor single crystal. The buffer layer 12 of AlN is grown by MOCVD. However, it may be of GaN, InN, AlGaN, GaInN, AlGaInN etc. and may be grown by molecular beam epitaxy (MBE), halide vapor phase epitaxy (HVPE), sputtering, ion plating etc. When the substrate 11 is of III group nitride system compound semiconductor, the buffer layer can be omitted.

Meanwhile, the substrate and buffer layer can be removed after forming the semiconductor element, when needed.

n-type layer 13 is of GaN, but it may be of AlGaN, GaInN or AlGaInN.

n-type impurity Si is doped in the n-type layer 13, but another n-type impurity, e.g. Ge, Se, Te and C, may be doped therein.

The quantum well structure 14 can be multiquantum well structure or single quantum well structure. The repeat number (pair number) in multiquantum well structure is preferably 2 to 15.

It is not limited whether AlGaN barrier layer exists between well layer (well layer closest to n-type layer 13 in case of multiquantum well structure) and n-type layer 13. Also, it is not limited whether AlGaN barrier layer exists between well layer (well layer closest to p-type layer 15 in case of multiquantum well structure) and p-type layer 15.

The quantum well structure 14 may include Mg doped III group nitride system compound semiconductor layer with a large bandgap on the p-type layer 15 side. This prevents electrons injected into the quantum well structure 14 from dispersing into p-type layer 15.

p-type layer 15 of GaN with p-type impurity Mg doped is grown on the quantum well structure 14. The p-type layer 15 may be of AlGaN, GaInN or AlGaInN. P-type impurity may be Zn, Be, Ca, Sr or Ba. After doping p-type impurity, the layer 15 can be treated by a known method such as electron beam radiation, annealing and plasma radiation to lower the resistivity but the treatment is not needed necessarily.

In this example, the III group nitride system compound semiconductor layer is grown, under general conditions, by MOCVD, molecular beam epitaxy (MBE), halide vapor phase epitaxy (HVPE), sputtering, ion plating etc.

n-type electrode 19 is composed of two layers of Al and V. After growing the p-type layer 15, part of the p-type layer 15, quantum well structure 14 and n-type layer 13 is removed by etching and the n-type electrode 19 is formed on n-type layer 13 by vapor deposition.

Transparent electrode 17 formed on the p-type layer 15 is thin film including gold. Also, p-type electrode 18 formed on the transparent electrode 17 by vapor deposition is of material including gold.

Figure 2:
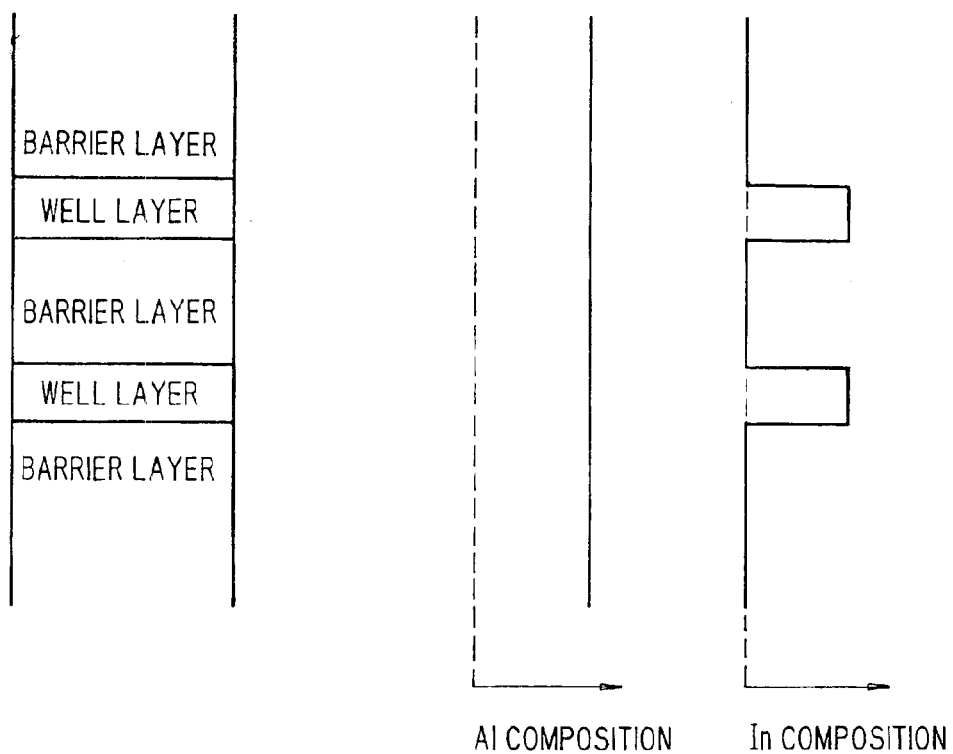
FIG. 2 is a chart showing the composition of Al and In in quantum well structure 14 of the light emitting element 10 in FIG. 1.

FIG. 2 is a chart showing the composition of Al and In in the quantum well structure 14 of the light emitting element 10. As shown, in this example, Al composition of well layer is the same as that of barrier layer. Instead, In composition of well layer is greater than that of barrier layer, whereby the bandgap energy thereof is reduced.

Figure 3:
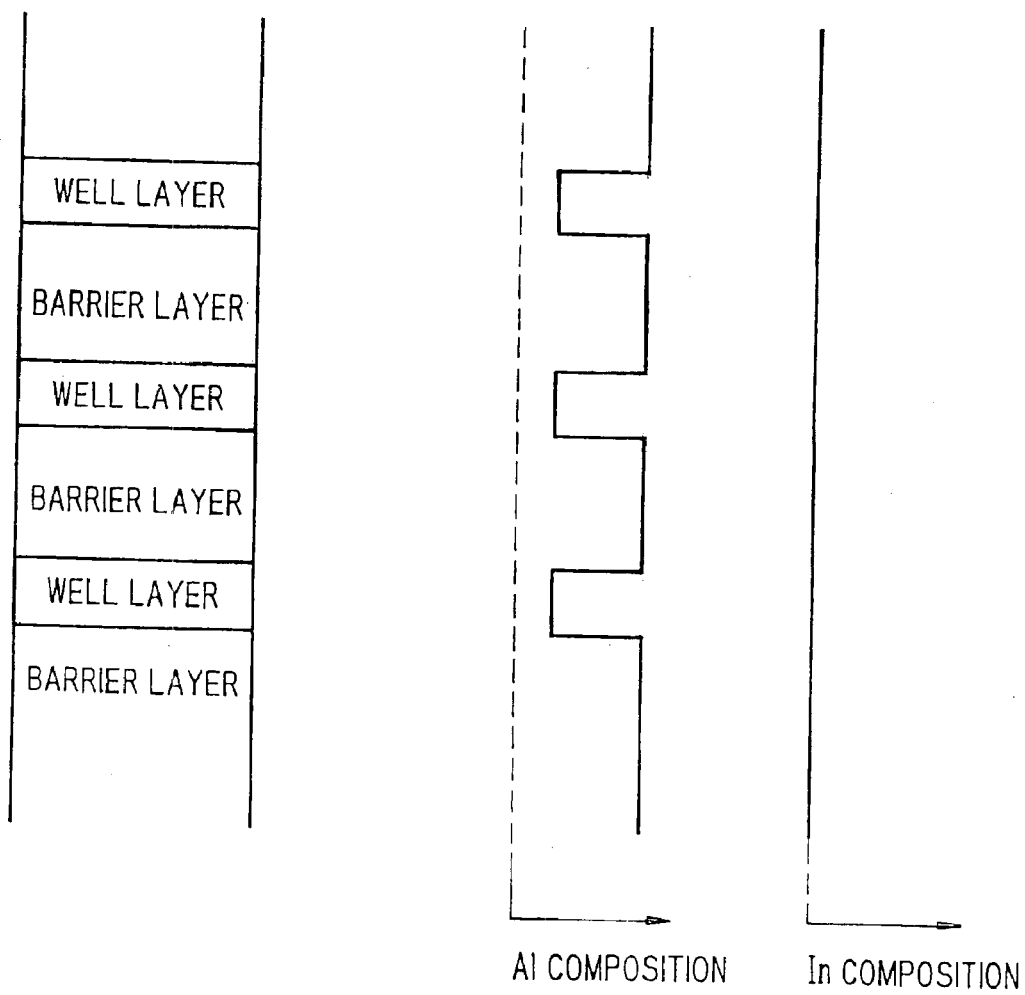
FIG. 3 is a chart showing the composition of Al and In in the conventional light emitting diode described in prior art 1.

FIG. 3 is a chart showing the composition of Al and In in the conventional light emitting diode described in prior art 1. As shown, in prior art 1, Al composition of well layer is smaller than that of barrier layer. Thus, the bandgap energy thereof is reduced.

The light emitting element 10 of this example has an emission peak near 350 nm and an emission output of 0.5 mW when forward current of 20 mA is applied. The emission output thereof is about twice that of the conventional light emitting diode of prior art 1 in FIG. 3 that has an emission peak at the same wavelength band.

EXAMPLE 2

A light emitting element (LED) in Example 2 will be detailed below. The light emitting element has the same layer structure shown in FIG. 1. The details of layers composing the light emitting element are as follows.

| Layers: | Composition |
| --- | --- |
| p-type layer 15: | p-GaN:Mg |
| quantum well structure 24: | $Al_{0.15}Ga_{0.79}In_{0.06}N$ (well layer) |
| (three pairs) | $Al_{0.14}Ga_{0.85}In_{0.01}N$ (barrier layer) |
| n-type layer 13: | n-GaN:Si |
| buffer layer 12: | AlN |
| substrate 11: | sapphire |

Figure 4:
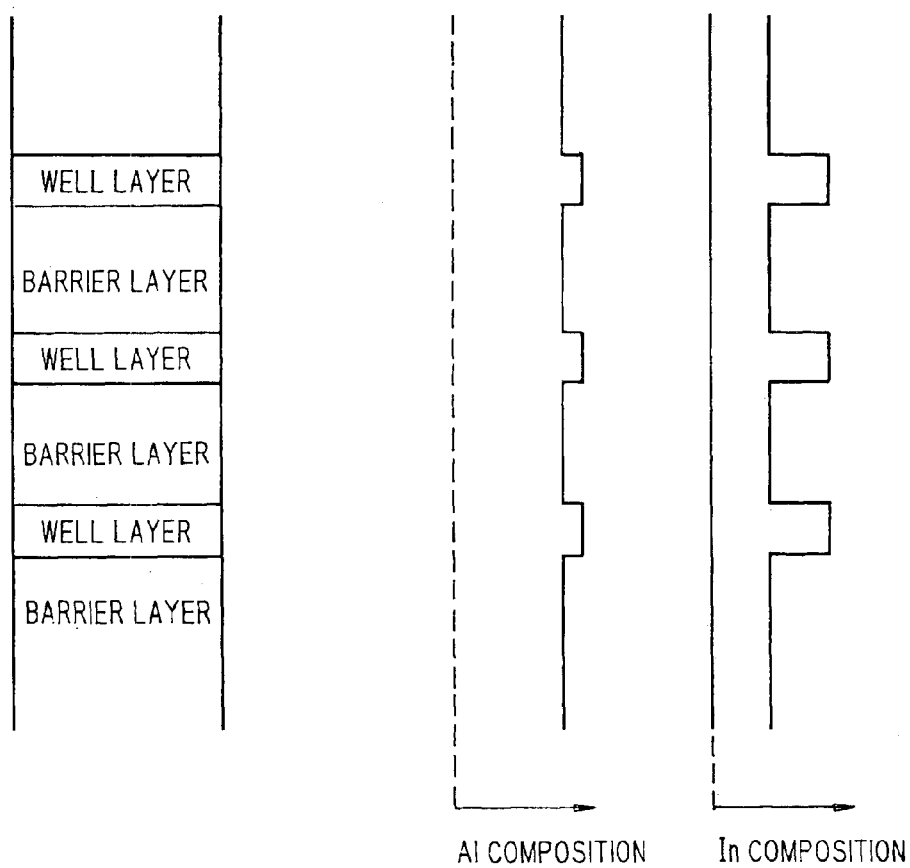
FIG. 4 is a chart showing the composition of Al and In in quantum well structure 24 of a light emitting element in a preferred embodiment (Example 2) according to the invention.

FIG. 4 is a chart showing the composition of Al and In in the quantum well structure 24 of the light emitting element in Example 2. As shown, in this example, Al composition of well layer is a little greater than that of barrier layer and In composition of well layer is greater than that of barrier layer, whereby the bandgap energy thereof is reduced.

The light emitting element 10 of this example has an emission peak near 350 nm and an emission output of 0.5 mW when forward current of 20 mA is applied. The emission output thereof is about twice that of the conventional light emitting diode of prior art 1 in FIG. 3 that has an emission peak at the same wavelength band.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A III group nitride system compound semiconductor light emitting element, comprising:

a quantum well structure that includes a well layer of $Al_{X1}Ga_{Y1}In_{1-X1-Y1}N$, where $0<X1$, $0 \leq Y1$ and $X1+Y1<1$ and a barrier layer of $Al_{X2}Ga_{Y2}In_{1-X2-Y2}N$, where $0<X2$, $0 \leq Y2$ and $X2+Y2 \leq 1$, wherein the Al composition (X2) of said barrier layer is equal to or smaller than that (X1) of said well layer.

2. The III group nitride system compound semiconductor light emitting element according to claim 1, wherein:

said barrier layer is of $Al_{X2}Ga_{Y2}In_{1-X2-Y2}N$, where $0<X2$, $0<Y2$ and $X2+Y2 \leq 1$.

3. The III group nitride system compound semiconductor light emitting element according to claim 1, wherein:

the Al compositions (X1, X2) of said well layer and said barrier layer are set to satisfy the relationship of $X2 \leq X1 \leq 1.5 \times X2$.

4. The III group nitride system compound semiconductor light emitting element according to claim 2, wherein:

the Al compositions (X1, X2) of said well layer and said barrier layer are set to satisfy the relationship of $X2 \leq X1 \leq 1.5 \times X2$.

5. The III group nitride system compound semiconductor light emitting element according to claim 1, wherein:

said well layer has substantially the same lattice constant as GaN layer that is a base layer of said quantum well structure.

6. The III group nitride system compound semiconductor light emitting element according to claim 2, wherein:

said well layer has substantially the same lattice constant as GaN layer that is a base layer of said quantum well structure.

7. The III group nitride system compound semiconductor light emitting element according to claim 3, wherein:

said well layer has substantially the same lattice constant as GaN layer that is a base layer of said quantum well structure.

8. A III group nitride system compound semiconductor light emitting element, comprising:

a quantum well structure that includes a well layer of $Al_{X1}Ga_{Y1}In_{1-X1-Y1}N$, where $0<X1$, $0 \leq Y1$ and $X1+Y1<1$ and a barrier layer of $Al_{X2}Ga_{Y2}In_{1-X2-Y2}N$, where $0<X2$, $0 \leq Y2$ and $X2+Y2<1$, wherein the Al composition (X2) of said barrier layer is equal to or smaller than that (X1) of said well layer, and the In composition of said well layer is greater than that of said barrier layer.

* * * * *